United States Patent
Clark

(10) Patent No.: US 7,050,784 B2
(45) Date of Patent: May 23, 2006

(54) WEATHER RADIO WITH CHANNEL ACQUISITION SYSTEM

(75) Inventor: John M. Clark, Crowley, TX (US)

(73) Assignee: RadioShack, Corp., Fort Worth, TX (US)

( * ) Notice: Subject to any disclaimer, the term of this patent is extended or adjusted under 35 U.S.C. 154(b) by 513 days.

(21) Appl. No.: 10/236,743

(22) Filed: Sep. 6, 2002

(65) Prior Publication Data

US 2004/0048573 A1    Mar. 11, 2004

(51) Int. Cl.
*H04M 11/00* (2006.01)

(52) U.S. Cl. .............. 455/404.1; 455/161.3; 455/184.1; 455/186.1

(58) Field of Classification Search ........... 455/3.02, 455/161.1–165.1, 166.2, 182.1–186.1, 192.1–192.3, 455/404, 404.1; 340/7.48

See application file for complete search history.

(56) References Cited

U.S. PATENT DOCUMENTS 6,329,904 B1 * 12/2001 Lamb .................. 340/286.02

2002/0075155 A1 * 6/2002 Guillory .................. 340/601

\* cited by examiner

*Primary Examiner*—Lee Nguyen
(74) *Attorney, Agent, or Firm*—Dan Brown Law Office; Daniel R. Brown

(57) ABSTRACT

A weather radio adapted to automatically select a preferred channel of operation. A receiver is coupled to a signal quality circuit that outputs signal quality parameters. A controller is coupled to control the frequency of reception of the receiver and is coupled to receive the signal quality parameters. A memory is used to store several signal quality values, and is coupled to the controller. When the controller receives a stimulus, it controls the receiver to sequentially receive all the weather radio frequencies of reception and store a signal quality value for each. The controller subsequently controls the receiver to receive one of the frequencies of operation based upon a comparison of the stored values to select a preferred one of them. The radio is therefore programmed to receive the preferred channel and monitor NOAA Weather Radio transmissions for the local FIPS codes and other weather alert messages.

21 Claims, 4 Drawing Sheets

WEATHER RADIO WITH CHANNEL ACQUISITION SYSTEM

BACKGROUND OF THE INVENTION

1. Field of the Invention

The present invention relates to radio communications. More specifically, the present invention relates to radio receivers that operate in conjunction with the National Oceanic and Atmospheric Administration's (NOAA) National Weather Service (NWS) weather alert broadcasting system.

2. Description of the Related Art

NOAA Weather Radio (NWR) is a United States government service that broadcasts National Weather Service (NWS) warnings, watches, forecasts and other hazard information twenty-four hours a day from a network of radio transmitters located throughout the United States. NOAA Weather Radio is known as the "voice of the National Weather Service," and is provided as a public service by the Department of Commerce's National Oceanic and Atmospheric Administration (NOAA).

The NOAA Weather Radio network comprises more than 650 broadcasting stations located in the 50 states and near adjacent coastal waters, Puerto Rico, the U.S. Virgin Islands and U.S. Pacific Territories. The NWS employs medium and low power transmitters deployed according to a frequency reuse plan to provide localized radio coverage within the network. Radio coverage areas may be in the range of approximately fifty miles, although actual radio coverage areas vary greatly due to the vagaries of radio wave propagation. Seven frequencies are set aside in the frequency reuse plan, and, they are tabulated in Table 1 below.

TABLE 1

| |
|---|
| 162.400 MHz |
| 162.425 MHz |
| 162.450 MHz |
| 162.475 MHz |
| 162.500 MHz |
| 162.525 MHz |
| 162.550 MHz |

Weather radios equipped with a special alarm tone feature are known in the prior art that can communicate an alert and provide immediate information about life-threatening situations whenever the alarm tone is received by the radio. During an emergency, National Weather Service forecasters interrupt routine weather radio programming and send out a special tone that is received by these radios and used to activate an alarm in weather radios located within the radio coverage area of any given NWR broadcast station.

Beyond weather information, the NWR network includes an "all hazards" capability. NOAA Weather Radio also broadcasts warning and post-event information for all types of hazards both natural (such as earthquakes and volcano activity) and technological (such as chemical releases or oil spills). In a cooperative effort with other Federal agencies and the Federal Communications Commission's Emergency Alert System (EAS), NOAA Weather Radio is thus the "all hazards" radio network, making it the single source for the most comprehensive weather and emergency information available to the public.

In recent years, the National Weather Service has improved the NOAA Weather Radio system to provide localized information and warning alerts, which go beyond the aforementioned radio coverage frequency reuse plan. The name of this localized service is Specific Area Message Encoding (SAME). To achieve the localized service, the NWR system broadcasts specific SAME codes along with the standard weather broadcasts from its various broadcast stations. The SAME codes identify the type of emergency and the specific geographic area affected by a particular emergency. Weather alert radios are known in the art that receive, interpret, and display information about the received SAME codes so that users can determine if an emergency might affect them in particular.

Each SAME alert includes at least one Federal Information Processing System (FIPS) code that identifies a specific geographic area, which is defined by the National Weather Service. It is known in the art to program weather radios to receive a particular NWR frequency and to activate an alarm consistent with a received SAME code when a previously programmed FIPS code is received within a SAME message. Thus, the system provides geographic information about which users a particular alert message is directed to, as well as specific information about the nature of the alert. The FIPS codes are six-digit numeric codes that define a geographic region, usually about the size of a typical state county or parish in the US. The first digit in a FIPS code generally identifies the county subdivision, the next two digits identify the state, and the last three digits identify a county or parish. For example, the FIPS code for Tarrant County, Texas is "048439". A listing of all FIPS codes is available from NOAA's NWS Internet web site. The SAME message alert codes cover a wide range of weather conditions, natural hazards, and technology hazards. By way of example, these include hazards related to avalanches, blizzards, civil emergencies, floods, fires, hazardous materials, high winds, hurricanes, law enforcement, radiological hazards, severe thunderstorms, tornadoes, tsunamis, volcanoes, winter storms, and other hazards.

In order for a user to benefit from the NWR alert broadcast system they must have a compliant radio receiver properly programmed and in operation to receive and decode SAME messages, so as to communicate alerts as they occur from time to time. Programming requires a user to read and understand the radio's user manual, and to operate the radio in such a way as to program the proper information into the radio. These operations are naturally prone to human error from time to time. Since there are plural FIPS code's and plural radio frequencies employed by the NWR broadcast system, it is essential that users program their radios accurately. For example, it is quite common for a radio receiver located in a particular geographic location to receive two, three, or more NWR broadcast frequencies. Each of these frequencies may transmit SAME messages having one, two, or more FIPS codes encoded therein. If the user tunes the radio to the wrong frequency, they may not receive their geographic FIPS encoded SAME messages. Even if the radio has plural FIPS codes programmed therein, which is known in the art, tuning the radio to the wrong frequency may still lead to missed SAME messages. Thus there is a need in the art for an apparatus and method that better ensures that users of NWR compliant radio receivers are programmed and tuned to the appropriate radio frequency, without the need for extensive manual programming operations by the user.

SUMMARY OF THE INVENTION

The need in the art is addressed by the apparatus and methods of the present invention. A radio is taught that includes a receiver and a signal quality circuit coupled to the receiver that has a received signal quality output. A controller is coupled to control the frequency of reception of the receiver and is also coupled to the output. A memory for storing plural signal quality values is also coupled to the controller. In operation, upon receipt of a stimulus, the controller controls the receiver to sequentially receive plural frequencies of reception and store plural signal quality values, consistent with the signal quality circuit output, in the memory corresponding to the plural frequencies of operation. The controller subsequently controls the receiver to receive one of the plural frequencies of operation based upon a preferred one of the plural signal quality values.

In a specific embodiment, the receiver is a weather radio receiver that operates to receive the frequencies of 162.400 MHz, 162.425 MHz, 162.450 MHz, 162.475 MHz, 162.500 MHz, 162.525 MHz, and 162.550 MHz. In other embodiments, the signal quality circuit outputs received signal quality according to received signal strength or the received signal to noise ratio. The signal quality circuit may be a received signal strength indicator (R.S.S.I.) circuit. In another embodiment, the radio further includes an actuator coupled to the controller, where activation of the actuator acts as the stimulus. Or, the controller may execute a software routine that provides the stimulus internally. In another specific embodiment, the radio further includes an analog to digital converter coupled to receive the received signal quality output as an analog signal and then digitize the analog signal prior to coupling it to the controller. In another embodiment, the preferred one of the plural signal quality values is the one of the plural signal values having the greatest or least magnitude.

In an illustrative embodiment, a weather radio for receiving signals from the NOAA Weather Radio broadcast systems is taught. The weather radio includes a receiver selectively tunable to receive plural frequencies in the NOAA Weather Radio band, currently including 162.400 MHz, 162.425 MHz, 162.450 MHz, 162.475 MHz, 162.500 MHz, 162.525 MHz, and 162.550 MHz. An R.S.S.I. signal quality circuit is coupled to the receiver and has an analog received signal quality output. A digital to analog converter is coupled to the output and operates to convert the analog received signal quality to a digital signal, suitable for digital manipulation. A controller is coupled to control the frequency of reception of the receiver and is also coupled to receive the digital signal. A memory for storing plural signal quality values is coupled to the controller as well. The controller, upon receipt of a stimulus, controls the receiver to sequentially receive the plural frequencies of reception and store plural signal quality values, consistent with the digital signal, in the memory corresponding to the plural frequencies of operation. Also, the controller subsequently controls the receiver to receive one of the plural frequencies of operation based upon a preferred one of the plural signal quality values that is selected as having the greatest or least magnitude.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
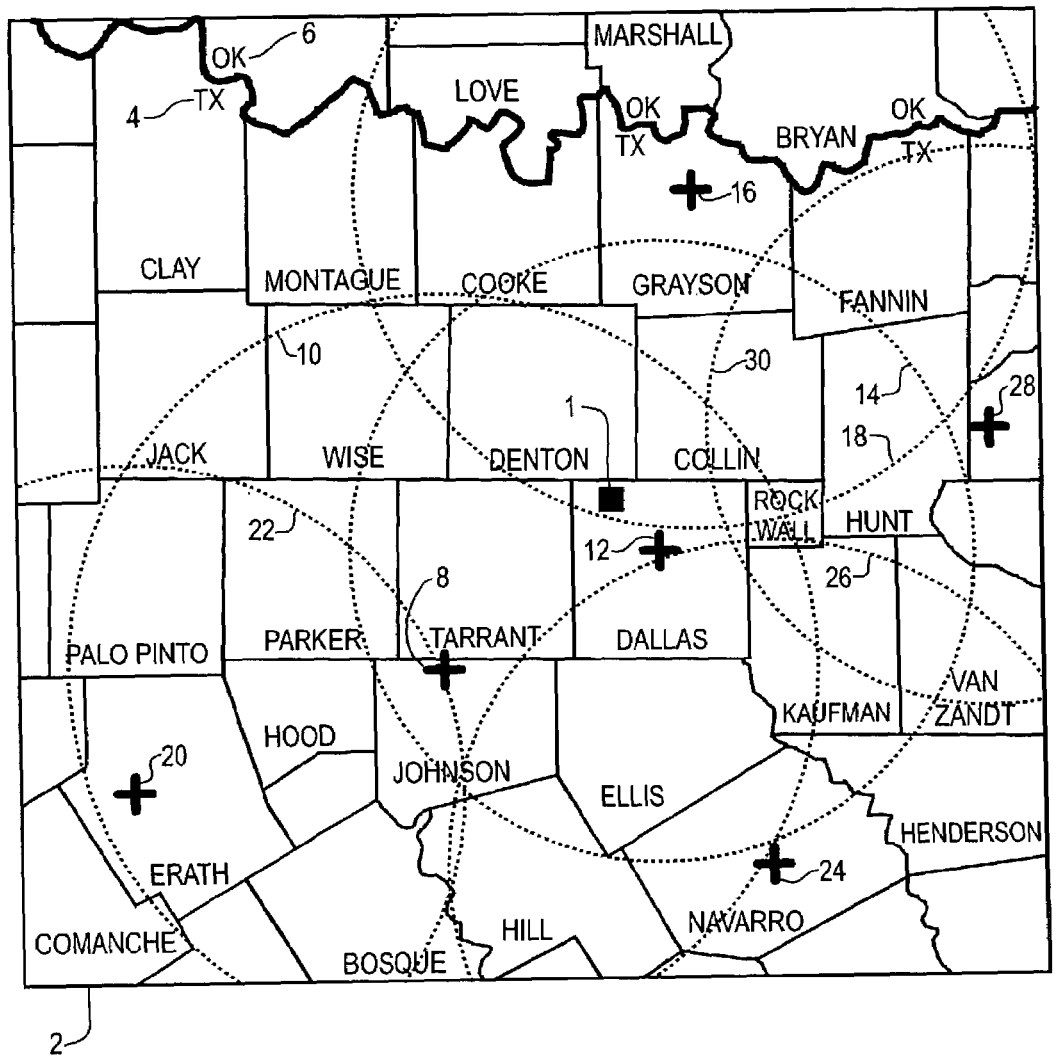
FIG. 1 is a map depicting plural NWS broadcast transmitters located about a region in which an illustrative embodiment weather radio operates.

FIG. 1 is a map 2 of a portion of North Texas in the area of Dallas and Fort Worth, which are located in Dallas County and Tarrant County respectively. An illustrative embodiment weather radio 1 is located in the northwest quadrant of Dallas County. The map 2 and weather radio 1 will be used to describe both the problem in the prior art and the advantages of the present invention with respect to the operation of weather radios in areas receiving multiple NWR broadcast coverage. Multiple NWR transmitters serve North Texas. In the geographic area depicted in map 2, there are six NWR broadcast transmitters, which are listed in Table 2 below.

TABLE 2

| Station | Ref. No. | Coverage | County | Frequency | Call Sign |
|---|---|---|---|---|---|
| Dallas | 12 | 14 | Dallas | 162.400 MHz | KEC56 |
| Cumby | 28 | 30 | Hopkins | 162.500 MHz | KWN31 |
| Corsicana | 24 | 26 | Navarro | 162.525 MHz | KXI67 |
| Dublin | 20 | 22 | Erath | 162.450 MHz | KWN33 |
| Fort Worth | 8 | 10 | Johnson | 162.550 MHz | KEC55 |
| Sherman | 16 | 18 | Grayson | 162.475 MHz | WXK22 |

The radio coverage area of each NWR broadcast station is approximated by a corresponding broken line. With respect to Table 2, the "Ref. No." column lists the drawing reference numeral associated with each NWR broadcast station and the "Coverage" column lists the drawing reference numeral associated with each corresponding coverage area broken line. Those skilled in the art will appreciate that the vagaries of radio wave propagation never define a simple circular area as an actual area of radio coverage. Rather, local terrain, vegetation, elevation, receiver sensitivity, antenna gain and elevation, and many other factors define a much more complex coverage map for each transmitter. However, the problem existing in the prior art is clearly illustrated using the simple circular approximation for radio coverage area. Note that the illustrative embodiment weather radio receiver 1 falls within the radio coverage area approximated for the Dallas station 12, the Forth Worth station 8, and the Sherman station 16, having radio coverage areas 14, 10, and 18 respectively. Prior art weather radios were either manually tuned to one station, which is prone to selection error, or automatically tuned in a simple sequential scan of the seven frequencies (see Table 1). In a sequential scan, the first station having adequate signal strength to quiet the receiver is selected as the default frequency of reception. Thus, there is a significant probability that a given weather radio receiver 1 will not be tuned to the NWR broadcast station that is designated for the user's county, or other geographic subdivision defined by the SAME FIPS code system. In FIG. 1, the weather radio 1 lies within Dallas County and therefore is preferably tuned to the Dallas NWR station 12. However, user programming error or a sequential tuning process may actually result in the radio 1 being tuned to the Fort Worth station 8 or the Sherman station 16, or perhaps some other station that propagates a signal of sufficient strength at location 1. This results in the user not receiving the best weather information, and, depending on the FIPS alert message encoding employed at the various NWR stations, may result in completely missing critical NOAA alerts.

The present invention overcomes the problems in the prior art by employing circuitry and software that scans all of the NWR broadcast frequencies, detecting the quality of each received radio signal. Values associated with each received signal's quality are stored in a memory and then a comparative process is employed to select the one of the plural received signals that is most likely to be the local county broadcast station signal. When this is combined with the user programmed FIPS code, or code's, the net result is an improvement in the likelihood that a given user will receive the preferred NWR broadcast station and have the proper FIPS code programmed.

Figure 2:
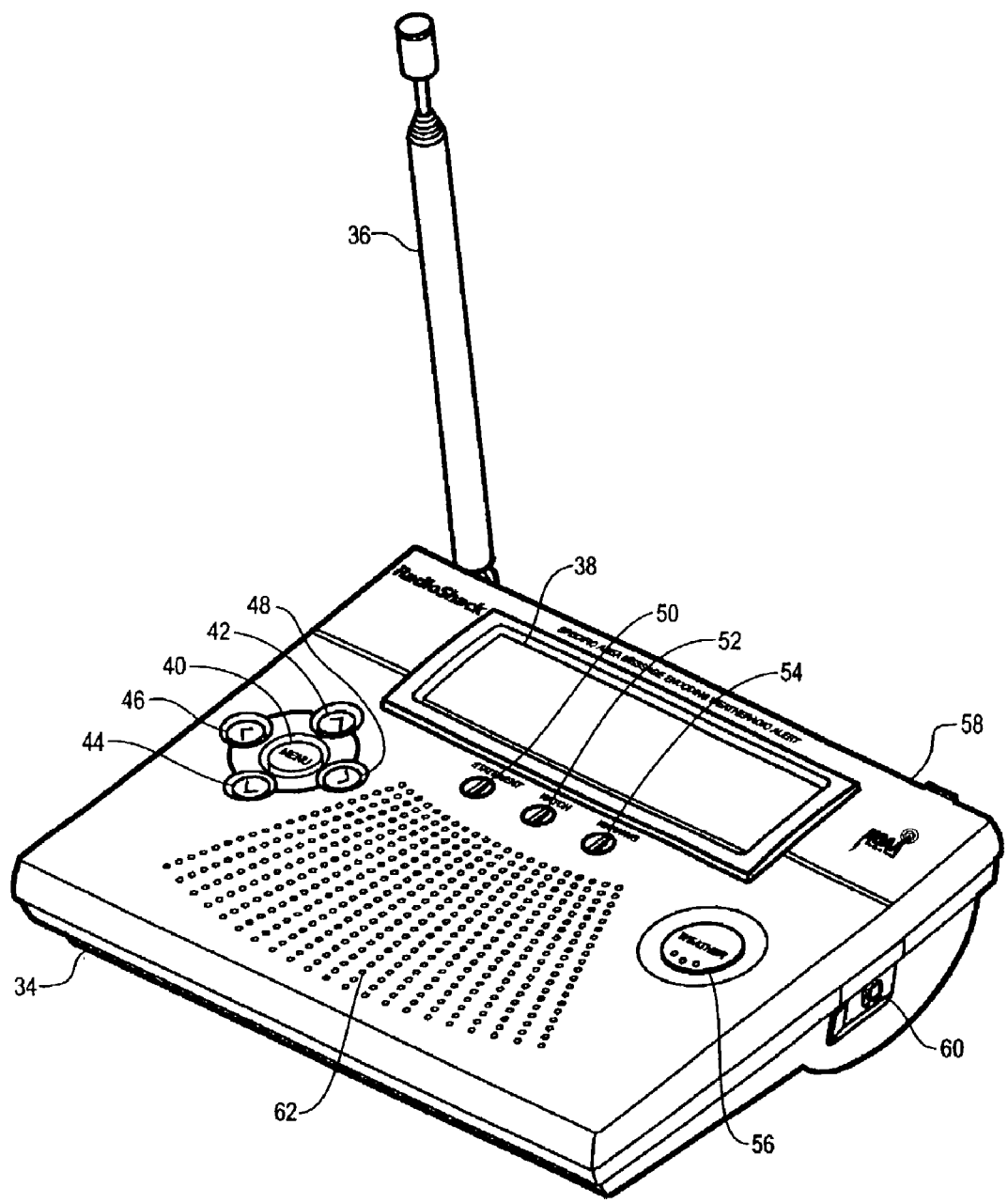
FIG. 2 is a perspective drawing of a weather radio according to an illustrative embodiment of the present invention.

Reference is directed to FIG. 2, which is a perspective drawing of a weather radio 34 according to an illustrative embodiment of the present invention. The weather radio is enclosed in a molded case, which supports the internal circuitry (not shown) and various user interface and external functional components. A loudspeaker grill 62 allows sound to propagate from an internal loudspeaker (not shown). A telescopic antenna 36 intercepts radio signals broadcast from NWR broadcast stations. A "Weather" actuator 56 causes the radio to receive and reproduce NWR audio broadcasts from a presently tuned default frequency with a single actuation by a user. A "Menu" actuator 40 and four directional actuators 42, 44, 46, and 48 provide user access to a function menu interface that operates in conjunction with a liquid crystal display 38. The display 38 is capable of reproducing alpha-numeric textual messages that appear in response to user actuation of the aforementioned actuators 40, 42, 44, 46, and 48. Those skilled in the art are familiar with menu driven user interface, and the general advantages of such systems. The menu interface allows a large number of features and functions to be logically organized and accessible with a relatively small number of input actuators.

The display 38 is also used to display alert messages and various programming data, such as FIPS codes, broadcast frequencies, and other parameters. In addition to textual information output, the weather radio 34 can also route alert tones to the loudspeaker for an audio indication. Three dedicated alert indicator lamps, or LED's, are also provided. These include a "Statement" indicator 50, a "Watch" indicator 52, and a "Warning" indicator 54. The three alert levels reflect the alert levels defined by the NWS that are encoded into certain SAME alert messages. When a SAME alert message having a FIPS code programmed into the weather radio 34 is broadcast on the presently received frequency of the radio, the radio decodes the SAME message and outputs and alert consistent with the level of alert decoded from the message. The appropriate indicator lamp 50, 52 or 54 is then illuminated to notify the user. The illustrative embodiment radio also includes a data interface 60 that allows interconnection of the device to a personal computer. Also, the back 58 of the radio 34 includes a DC power input connector (not shown), an alert on/off switch (not shown) and an alarm output connector (not shown). Such connections are known in the art and used in prior art weather radio designs.

Figure 3:
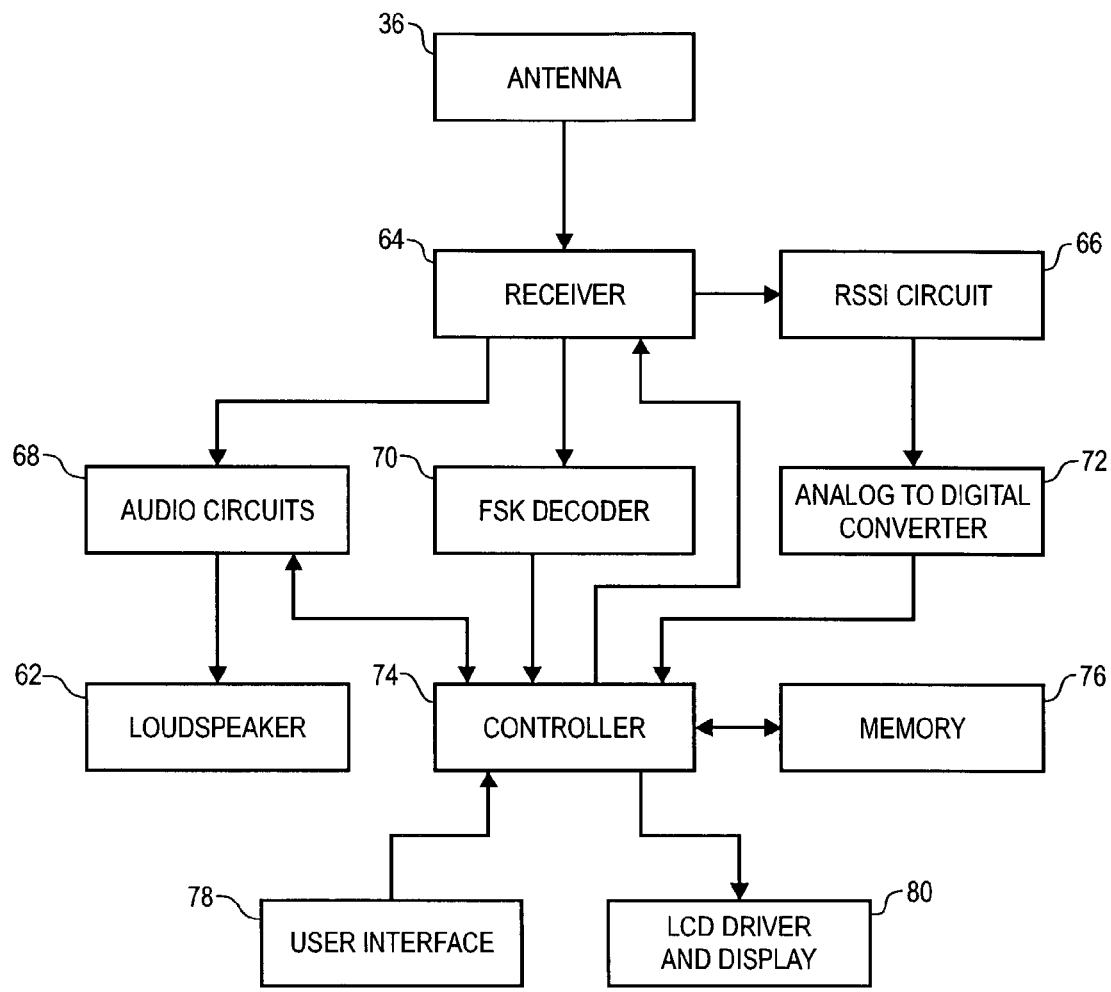
FIG. 3 is a functional block diagram of a weather radio according to an illustrative embodiment of the present invention.

Reference is directed to FIG. 3, which is a functional block diagram of a weather radio according to an illustrative embodiment of the present invention. Radio signals transmitted from a NWR broadcast station are received by antenna 36, which may be an internal antenna or an externally connected antenna. The received signals are coupled to a conventional VHF radio receiver 64 that is selectively tunable to the seven NWS radio frequencies. In the illustrative embodiment, a phase-locked-loop circuit is used that employs a stable reference oscillator such that the controller 74 is able to selectively tune the receiver 64 to any of the seven NWS broadcast frequencies. Those skilled in the art will appreciate that other selectively tunable receiver circuit topologies could readily be employed. A signal quality circuit 66 is coupled to the receiver 64 and outputs a signal indicative of the received signal quality. In the illustrative embodiment, a received signal strength indication circuit 66, known to those skilled in the art as an R.S.S.I. circuit, is employed. The R.S.S.I. circuit 66 outputs an analog signal whose magnitude is proportional to the received signal strength. Other signal quality circuits known to those skilled in the art can also be employed as well. For example, a signal-to-noise circuit or a carrier-to-noise circuit could be used. The signal quality circuit 66 may also employ integration techniques so that the received signal quality can be averaged over time. In the illustrative embodiment, the analog signal output from R.S.S.I. circuit 66 is coupled to an analog to digital converter 72 where the analog signal is sampled and digitized for later manipulation by controller 74. The demodulated received signal is output from the receiver 64 to both a frequency shift keying (FSK) decoder circuit 70 and to audio conditioning circuits 68.

The FSK decoder circuit 70 receives the base-band demodulated signal from the receiver 64 and decodes the FSK-encoded SAME messages, which are FSK-modulated within the base-band signal, as is known to those skilled in the art. The content of SAME messages are known to those skilled in the art and specifications for them are available from NOAA and the National Weather Service. Essentially, SAME messages include certain warning codes and FIPS codes. Once the SAME messages are decoded by FSK decoder 70, the contents of the SAME messages are coupled to controller 74 where they are interpreted, stored in memory 76, and acted upon as required from message to message, and according to the radio programming. For example, a SAME message might include a tornado warning code with a FIPS code for a particular county. A weather radio that is tuned to the particular broadcast, and that has the particular FIPS code programmed for reception, will activate a tornado warning in response to the received message. The base-band received signal output from receiver 64 is also coupled to audio conditioning circuits 68. A digital volume control is included within the audio circuits 68 and is controlled by controller 74. Radio volume selection is a function of the aforementioned menu driven user interface. When the user desires to adjust the speaker volume of the received audio signal, or the speaker volume of the alarm tones, the appropriate menu selection is activated and up-down actuators are manipulated to achieve the desired volume adjustment. Tone generating and filtering circuits are also included in audio circuits 68 so that the needed tones can be produced and controlled by controller 74. Ultimately, the received audio signals are coupled to loudspeaker 62 for listening by a user.

Referring again to the analog to digital circuit 72, this circuit outputs a digitized version of the signal quality information received from the signal quality circuit 66, which is an R.S.S.I. circuit in the illustrative embodiment. The digitized output from the analog to digital converter 72 is coupled to controller 74. The digitized information is associated with the particular radio frequency being received at the time the controller 74 reads the information and the value is stored in memory 76 for later recollection and analyses by controller 74. Controller 74 may be of any of the types known and used in dedicated control applications, including processor, microprocessors, controllers, microcontrollers, digital signal processors and other programmable control devices. A memory 76 is provided for storing signal quality information, FIPS codes, SAME messages and alerts, executable software, variable, and other information that needs to be stored or recalled by controller 74 from time to time. The various functions depicted in FIG. 3 may be combined depending on the level of circuit integration employed by the designer of a product.

Continuing in FIG. 3, the controller 74 is coupled to a user interface 78, which includes the various push button actuators, switch actuators and indicator lamps described elsewhere. In the illustrative embodiment, the key actuators are arranged in a key matrix that is scanned by controller 74 for detection of actuation events by a user. The executable software running on controller 74 is responsive to key actuation events and embodies the user interface functionality of the weather radio. An LCD driver and LCD display 80 are also employed in the illustrative embodiment weather radio. The LCD display 80 is an alpha-numeric type and serves to present menu options to the users, as well as communicate alerts and other operational information. Certain icons are also included in the display 80 for convenient indication of operational events. Use and implementation of LCD displays are well known to those skilled in the art.

Figure 4:
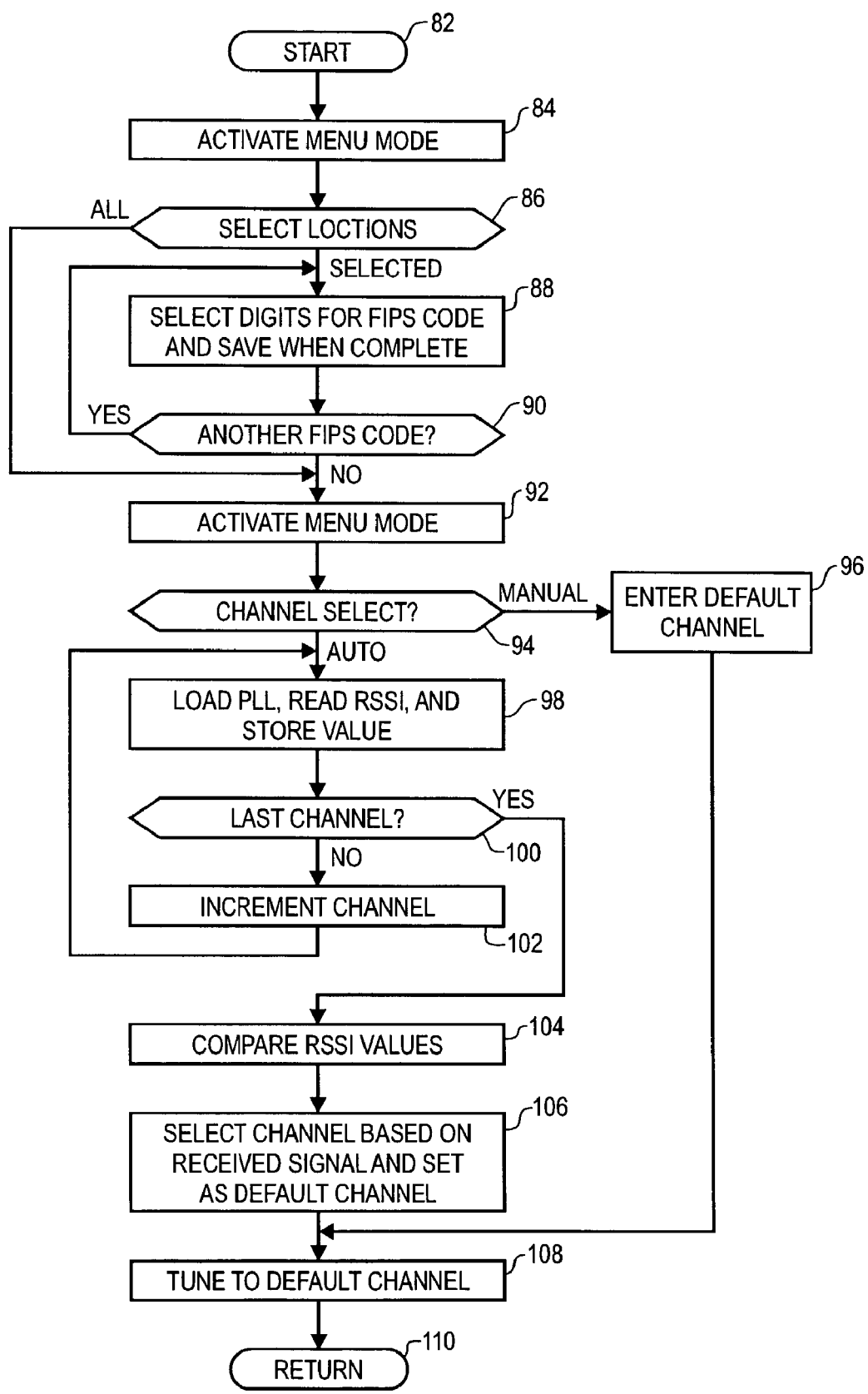
FIG. 4 is a radio flow diagram according to an illustrative embodiment of the present invention.

Reference is directed to FIG. 4, which is a flow diagram of the radio channel selection process according to an illustrative embodiment of the present invention. The process starts at step 82 and proceeds to step 84 where the menu mode of operation is activated. This is the aforementioned menu interface of the illustrative embodiment weather radio. The user selects the mode of entry for FIPS location codes as either ALL locations or specifically SELECTED locations at step 86. If ALL locations are chosen at step 86, then the radio will respond to all of the weather alerts that it receives. Thus, no specific FIPS location codes need to be entered and flow proceeds immediately to step 92, discussed hereinafter. On the other hand, at step 86, if the user chooses to SELECT specific FIPS location codes, then flow proceeds to step 88 where the user enters the required digits for the desired FIPS location code. The required digits are available from printed literature as well as the NOAA NWS Internet web site. As each code is entered (and there may be just a single code) the user is queried at step 90 to determine if another FIPS location code is to be entered. If YES, flow returns to step 88 to allow entry of another FIPS location code. If NO additional codes are desired by the user at step 90, then flow proceeds to step 92.

Having entered the desired FIPS location codes at steps 88 and 90, the process returns to an idle state until the user again activates the menu mode at step 92 to initiate the channel selection process. This is the process through which the radio determines what radio frequency, or channel, to monitor as the local default channel. The user is queried to choose manual or automatic channel selection at step 94. If the user selects the MANUAL mode of channel selection, then the user enters this information at step 96 and the process proceeds to step 108, discussed hereinafter. On the other hand, at step 94, if the user selects the AUTO mode of default channel selection, then flow proceeds to step 98. Step 98 is the beginning of an automated iterative process that scans all seven NOAA NWR channels and checks for signal quality. This is accomplished by loading the first channel at step 98. In the illustrative embodiment, the channel is defined by loading the phase locked loop with the proper channel divisor, which tunes the receiver, and then reading the signal quality, which is the R.S.S.I. value. This value is stored in the memory at a location associated with the present radio channel. Then flow proceeds to step 100. Step 100 is a test to determine if the last of the seven channels has been loaded and measured. If not, flow continues to step 102 where the channel divisor is incremented and then returns back to step 98 to load and measure the next channel. Once all of the channels have been measured and the associated signal quality value stored, the last channel test is successful at step 100 and flow proceeds to step 104.

At step 104, the controller compares the stored R.S.S.I. values. At step 106, the best channel, meaning the channel with the strongest received signal, is selected and defined as the default radio channel. This is the specific embodiment of the illustrative embodiment weather radio. In the case where the signal quality parameter is different, such as signal to noise ratio, then the channel selection algorithm is adapted accordingly. The essential process is to check the signal quality of all the channels, and then select the preferred one of the plural channels as the default channel. Having selected a default channel, flow continues to step 108 where the radio is tuned to the default channel for subsequent operation. The process returns at step 110.

Thus, the present invention has been described herein with reference to particular embodiments for particular applications. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A radio for decoding messages in accordance with a previously stored geographic location code, comprising:
    a receiver;
    a signal quality circuit, coupled to said receiver, having a received signal quality output;
    a controller coupled to control the frequency of reception of said receiver and coupled to said output;
    a memory for storing plural signal quality values and the geographic location code coupled to said controller, and wherein
    said controller, upon receipt of a stimulus, controls said receiver to sequentially receive plural frequencies of reception and store plural signal quality values, consistent with said signal quality circuit output, in said memory corresponding to said plural frequencies of operation, and wherein
    said controller subsequently controls said receiver to receive one of said plural frequencies of operation based upon a preferred one of said plural signal quality values, and upon reception of a message having location data corresponding to the previously stored geographic location code, said controller operable to decode said message.

2. The apparatus of claim 1 wherein said receiver is a weather radio receiver.

3. The apparatus of claim 2 wherein said weather radio receiver is operable to receive frequencies in the NOAA Weather Radio band, and wherein the messages are NOAA Specific Area Message Encoding messages and the geographic location code is a NOAA Federal Information Processing System encoded.

4. The apparatus of claim 1 wherein said signal quality circuit outputs received signal quality according to received signal strength.

5. The apparatus of claim 1 wherein said signal quality circuit outputs received signal quality according to the received signal to noise ratio.

6. The apparatus of claim 1 wherein said signal quality circuit is a received signal strength indication (R.S.S.I.) circuit.

7. The apparatus of claim 1, farther comprising:
an actuator coupled to said controller, and
wherein activation of said actuator acts as said stimulus.

8. The apparatus of claim 1 wherein said controller executes a software routine that provides said stimulus.

9. The apparatus of claim 1, further comprising:
an analog to digital convener coupled to receive said received signal quality output as an analog signal and digitize said analog signal prior to coupling to said controller.

10. The apparatus of claim 1 wherein said preferred one of said plural signal quality values is the one of said plural signal values having the greatest or least magnitude.

11. A weather radio for receiving signals from the NOAA Weather Radio broadcast systems and for decoding received messages in accordance with a previously stored NOAA Federal Information Processing System geographic location code, comprising:
a receiver selectively tunable to receive plural frequencies, including 162.400 MHz, 162.425 MHz, 162.450 MHz, 162.475 MHz, 162.4500 MHz, 162.525 MHz, and 162.550 MHz
a received signal strength indication (R.S.S.I.) signal quality circuit, coupled to said receiver, having an analog received signal quality output;
an analog to digital converter coupled to said output and operable to convert said analog received signal quality to a digital signal;
a controller coupled to control the frequency of reception of said receiver and coupled to receive said digital signal;
a memory for storing plural signal quality values and the geographic location code coupled to said controller, and wherein
said controller, upon receipt of a stimulus, controls said receiver to sequentially receive said plural frequencies of reception and store plural signal quality values, consistent with said digital signal, in said memory corresponding to said plural frequencies of operation, and wherein
said controller subsequently controls said receiver to receive one of said plural frequencies of operation based upon a preferred one of said plural signal quality values that is selected as having the greatest or least magnitude, and upon reception of a message having location data corresponding to the previously stored geographic location code, said controller operable to decode said message.

12. A method of selecting a preferred frequency of reception and far decoding messages in accordance with geographic location codes, in a radio having a receiver and a memory for storing a geographic Location code, comprising the steps of:
storing the geographic location code in the memory;
sequentially tuning the receiver to receive plural frequencies of reception;
determining plural signal quality values corresponding to said plural frequencies of reception;
selecting a preferred one of said plural frequencies of reception based upon said plural signal quality values;
tuning the receiver to said preferred one of said plural frequencies of reception, and
upon receiving a message having location data corresponding to the geographic location code stored in the memory, decoding the message.

13. The method of claim 12 wherein said receiver is a weather radio receiver.

14. The method of claim 13 wherein said plural frequencies of reception are in the NOAA Weather Radio band, and wherein the messages are NOAA Specific Area Message Encoding messages and the geographic location code is a NOAA Federal Information Processing System encoded.

15. The method of claim 12 wherein said determining step is accomplished with a signal quality circuit in the radio tat outputs a received signal quality according to received signal strength.

16. The method of claim 12 wherein said determining step is accomplished with a signal quality circuit in the radio that outputs received signal quality according to the received signal to noise ratio.

17. The method of claim 12 wherein said determining step is accomplished by a received signal strength indication (R.S.S.I) circuit in the radio.

18. The method of Claim 12, wherein the radio includes an actuator, further comprising the steps of:
actuating the actuator, and
executing said sequentially tuning step in response to said actuating step.

19. The method of claim 12 wherein the radio has a controller that executes a software routine, and wherein said sequentially tuning step occurs automatically within the software routine.

20. The method of claim 12 wherein said selecting step selects said preferred one of said plural signal quality values as the one of said plural signal values having the greatest or least magnitude.

21. The method of claim 12 wherein the radio has a memory, further comprising the step of:
storing said plural signal values in the memory.

* * * * *